United States Patent
Chen et al.

(10) Patent No.: US 9,508,455 B2
(45) Date of Patent: Nov. 29, 2016

(54) MEMORY DEVICE AND OPERATING METHOD THEREOF FOR REDUCING INTERFERENCE BETWEEN MEMORY CELLS

(71) Applicant: MACRONIX INTERNATIONAL CO., LTD., Hsinchu (TW)

(72) Inventors: Chung-Kuang Chen, Hsinchu (TW); Han-Sung Chen, Hsinchu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 141 days.

(21) Appl. No.: 14/595,252

(22) Filed: Jan. 13, 2015

(65) Prior Publication Data

US 2016/0203878 A1    Jul. 14, 2016

(51) Int. Cl.
*G11C 7/10* (2006.01)
*G11C 29/50* (2006.01)
*G11C 29/00* (2006.01)

(52) U.S. Cl.
CPC ....... *G11C 29/50016* (2013.01); *G11C 7/1036* (2013.01); *G11C 29/86* (2013.01)

(58) Field of Classification Search
CPC .......... G11C 29/50016; G11C 7/1036; G11C 29/86
USPC ................. 365/189.05, 185.22, 129, 189.16, 365/189.17, 230.08
See application file for complete search history.

(56) References Cited

U.S. PATENT DOCUMENTS 9,245,646 B2 *  1/2016  Moschiano ........ G11C 16/3459

* cited by examiner

*Primary Examiner* — Fernando Hidalgo
(74) *Attorney, Agent, or Firm* — McClure, Qualey & Rodack, LLP

(57) ABSTRACT

An operating method of a memory device comprises the following steps: a first page buffer receives a first input data to be programed into a first memory cell of the memory cells; a second page buffer receives a second input data to be programed into a second memory cell of the memory cells; and the first page buffer determines whether to shift a program verify (PV) voltage for the first input data according to the first and second input data.

20 Claims, 11 Drawing Sheets

| PB1 | PB2 | PB3 | | PB1 | PB2 | PB3 | | PB1 | PB2 | PB3 | | PB1 | PB2 | PB3 |
|---|---|---|---|---|---|---|---|---|---|---|---|---|---|---|
| 4 | 4 | 4 | | 3 | 4 | 4 | | 2 | 4 | 4 | | 1 | 4 | 4 |
| 4 | 3 | 4 | | 3 | 3 | 4 | | 2 | 3 | 4 | | 1 | 3 | 4 |
| 4 | 2 | 4 | | 3 | 2 | 4 | | 2 | 2 | 4 | | 1 | 2 | 4 |
| 4 | 1 | 4 | | 3 | 1 | 4 | | 2 | 1 | 4 | | 1 | 1 | 4 |
| | | | | | | | | | | | | | | |
| 4 | 4 | 3 | | 3 | 4 | 3 | | 2 | 4 | 3 | | 1 | 4 | 3 |
| 4 | 3 | 3 | | 3 | 3 | 3 | | 2 | 3 | 3 | | 1 | 3 | 3 |
| 4 | 2 | 3 | | 3 | 2 | 3 | | 2 | 2 | 3 | | 1 | 2 | 3 |
| 4 | 1 | 3 | | 3 | 1 | 3 | | 2 | 1 | 3 | | 1 | 1 | 3 |
| | | | | | | | | | | | | | | |
| 4 | 4 | 2 | | 3 | 4 | 2 | | 2 | 4 | 2 | | 1 | 4 | 2 |
| 4 | 3 | 2 | | 3 | 3 | 2 | | 2 | 3 | 2 | | 1 | 3 | 2 |
| 4 | 2 | 2 | | 3 | 2 | 2 | | 2 | 2 | 2 | | 1 | 2 | 2 |
| 4 | 1 | 2 | | 3 | 1 | 2 | | 2 | 1 | 2 | | 1 | 1 | 2 |
| | | | | | | | | | | | | | | |
| 4 | 4 | 1 | | 3 | 4 | 1 | | 2 | 4 | 1 | | 1 | 4 | 1 |
| 4 | 3 | 1 | | 3 | 3 | 1 | | 2 | 3 | 1 | | 1 | 3 | 1 |
| 4 | 2 | 1 | | 3 | 2 | 1 | | 2 | 2 | 1 | | 1 | 2 | 1 |
| 4 | 1 | 1 | | 3 | 1 | 1 | | 2 | 1 | 1 | | 1 | 1 | 1 |

FIG. 6

| PB1 | PB2 | PB3 | | PB1 | PB2 | PB3 | | PB1 | PB2 | PB3 | | PB1 | PB2 | PB3 |
|---|---|---|---|---|---|---|---|---|---|---|---|---|---|---|
| 4' | 4' | 4' | | 3' | 4' | 4' | | 2' | 4' | 4' | | 1' | 4' | 4' |
| 4' | 3' | 4' | | 3 | 3' | 4' | | 2 | 3' | 4' | | 1 | 3' | 4' |
| 4 | 2' | 4 | | 3 | 2' | 4 | | 2 | 2' | 4 | | 1 | 2' | 4 |
| 4 | 1' | 4 | | 3 | 1' | 4 | | 2 | 1' | 4 | | 1 | 1' | 4 |
| | | | | | | | | | | | | | | |
| 4' | 4' | 3' | | 3' | 4' | 3' | | 2' | 4' | 3' | | 1' | 4' | 3' |
| 4' | 3' | 3 | | 3 | 3 | 3 | | 2 | 3 | 3 | | 1 | 3 | 3 |
| 4 | 2' | 3 | | 3 | 2 | 3 | | 2 | 2 | 3 | | 1 | 2 | 3 |
| 4 | 1' | 3 | | 3 | 1 | 3 | | 2 | 1 | 3 | | 1 | 1 | 3 |
| | | | | | | | | | | | | | | |
| 4' | 4' | 2' | | 3' | 4' | 2' | | 2' | 4 | 2' | | 1' | 4 | 2' |
| 4' | 3' | 2 | | 3 | 3 | 2 | | 2 | 3 | 2 | | 1 | 3 | 2 |
| 4 | 2' | 2 | | 3 | 2 | 2 | | 2 | 2 | 2 | | 1 | 2 | 2 |
| 4 | 1' | 2 | | 3 | 1 | 2 | | 2 | 1 | 2 | | 1 | 1 | 2 |
| | | | | | | | | | | | | | | |
| 4' | 4' | 1' | | 3' | 4' | 1' | | 2' | 4 | 1' | | 1' | 4 | 1' |
| 4' | 3' | 1 | | 3 | 3 | 1 | | 2 | 3 | 1 | | 1 | 3 | 1 |
| 4 | 2' | 1 | | 3 | 2 | 1 | | 2 | 2 | 1 | | 1 | 2 | 1 |
| 4 | 1' | 1 | | 3 | 1 | 1 | | 2 | 1 | 1 | | 1 | 1 | 1 |

FIG. 7

|  | PB1 | PB2 | PB3 |  | PB1 | PB2 | PB3 |  | PB1 | PB2 | PB3 |  | PB1 | PB2 | PB3 |
|---|---|---|---|---|---|---|---|---|---|---|---|---|---|---|---|
| CVT PRD | 4' 00 | 4' 00 | 4' 00 |  | 3' 11/01 | 4' 00 | 4' 00 |  | 2' 11 | 4' 00 | 4' 00 |  | 1' 11 | 4' 00 | 4' 00 |
|  | 4' 00 | 3' 11/01 | 4' 00 |  | 3 11 | 3' 11/01 | 4' 00 |  | 2 11 | 3' 11/01 | 4' 00 |  | 1 11 | 3' 11/01 | 4' 00 |
|  | 4 01/00 | 2' 11 | 4 01/00 |  | 3 11 | 2' 11 | 4 01/00 |  | 2 11 | 2' 11 | 4 01/00 |  | 1 11 | 2' 11 | 4 01/00 |
|  | 4 01/00 | 1' 11 | 4 01/00 |  | 3 11 | 1' 11 | 4 01/00 |  | 2 11 | 1' 11 | 4 01/00 |  | 1 11 | 1' 11 | 4 01/00 |
|  |  |  |  |  |  |  |  |  |  |  |  |  |  |  |  |
|  | 4' 00 | 4' 00 | 3' 11/01 |  | 3' 11/01 | 4' 00 | 3' 11/01 |  | 2' 11 | 4' 00 | 3' 11/01 |  | 1' 11 | 4' 00 | 3' 11/01 |
|  | 4' 00 | 3' 11/01 | 3 11 |  | 3 11 | 3 11 | 3 11 |  | 2 11 | 3 11 | 3 11 |  | 1 11 | 3 11 | 3 11 |
|  | 4 01/00 | 2' 11 | 3 11 |  | 3 11 | 2 11 | 3 11 |  | 2 11 | 2 11 | 3 11 |  | 1 11 | 2 11 | 3 11 |
|  | 4 01/00 | 1' 11 | 3 11 |  | 3 11 | 1 11 | 3 11 |  | 2 11 | 1 11 | 3 11 |  | 1 11 | 1 11 | 3 11 |
|  |  |  |  |  |  |  |  |  |  |  |  |  |  |  |  |
|  | 4' 00 | 4' 00 | 2' 11 |  | 3' 11/01 | 4' 00 | 2' 11 |  | 2' 11 | 4' 01/00 | 2' 11 |  | 1' 11 | 4' 01/00 | 2' 11 |
|  | 4' 00 | 3' 11/01 | 2 11 |  | 3 11 | 3 11 | 2 11 |  | 2 11 | 3 11 | 2 11 |  | 1 11 | 3 11 | 2 11 |
|  | 4 01/00 | 2' 11 | 2 11 |  | 3 11 | 2 11 | 2 11 |  | 2 11 | 2 11 | 2 11 |  | 1 11 | 2 11 | 2 11 |
|  | 4 01/00 | 1' 11 | 2 11 |  | 3 11 | 1 11 | 2 11 |  | 2 11 | 1 11 | 2 11 |  | 1 11 | 1 11 | 2 11 |
|  |  |  |  |  |  |  |  |  |  |  |  |  |  |  |  |
|  | 4' 00 | 4' 00 | 1' 11 |  | 3' 11/01 | 4 00 | 1' 11 |  | 2' 11 | 4 01/00 | 1' 11 |  | 1' 11 | 4 01/00 | 1' 11 |
|  | 4' 00 | 3' 11/01 | 1 11 |  | 3 11 | 3 11 | 1 11 |  | 2 11 | 3 11 | 1 11 |  | 1 11 | 3 11 | 1 11 |
|  | 4 01/00 | 2' 11 | 1 11 |  | 3 11 | 2 11 | 1 11 |  | 2 11 | 2 11 | 1 11 |  | 1 11 | 2 11 | 1 11 |
|  | 4 01/00 | 1' 11 | 1 11 |  | 3 11 | 1 11 | 1 11 |  | 2 11 | 1 11 | 1 11 |  | 1 11 | 1 11 | 1 11 |

FIG. 11

|  | PB1 | PB2 | PB3 |  | PB1 | PB2 | PB3 |  | PB1 | PB2 | PB3 |  | PB1 | PB2 | PB3 |
|---|---|---|---|---|---|---|---|---|---|---|---|---|---|---|---|
| PRDR | 00 | 00 1 | 00 |  | 11/01 | 00 1 | 00 |  | 11 | 00 1 | 00 |  | 11 | 00 1 | 00 |
|  | 00 | 11/01 1 | 00 |  | 11 | 11/01 1 | 00 |  | 11 | 11/01 1 | 00 |  | 11 | 11/01 1 | 00 |
|  | 01/00 ?/1 | 11 | 01/00 |  | 11 | 11 ?/1 | 01/00 |  | 11 | 11 ?/1 | 01/00 |  | 11 | 11 ?/1 | 01/00 |
|  | 01/00 ?/1 | 11 | 01/00 |  | 11 | 11 ?/1 | 01/00 |  | 11 | 11 ?/1 | 01/00 |  | 11 | 11 ?/1 | 01/00 |
|  |  |  |  |  |  |  |  |  |  |  |  |  |  |  |  |
|  | 00 | 00 1 | 11/01 1 |  | 11/01 | 00 0/1 | 11/01 |  | 11 | 00 0/1 | 11/01 |  | 11 | 00 0/1 | 11/01 |
|  | 00 | 11/01 1 | 11 |  | 11 | 11 0 | 11 |  | 11 | 11 0 | 11 |  | 11 | 11 0 | 11 |
|  | 01/00 ?/1 | 11 | 11 |  | 11 | 11 0 | 11 |  | 11 | 11 0 | 11 |  | 11 | 11 0 | 11 |
|  | 01/00 ?/1 | 11 | 11 |  | 11 | 11 0 | 11 |  | 11 | 11 0 | 11 |  | 11 | 11 0 | 11 |
|  |  |  |  |  |  |  |  |  |  |  |  |  |  |  |  |
|  | 00 | 00 1 | 00 |  | 11/01 | 00 1 | 00 |  | 11 | 00 1 | 00 |  | 11 | 11/01 1 | 00 |
|  | 00 | 11/01 1 | 11 |  | 11 | 11 0 | 11 |  | 11 | 11 0 | 11 |  | 11 | 11 0 | 11 |
|  | 01/00 ?/1 | 11 | 11 |  | 11 | 11 0 | 11 |  | 11 | 11 0 | 11 |  | 11 | 11 0 | 11 |
|  | 01/00 ?/1 | 11 | 11 |  | 11 | 11 0 | 11 |  | 11 | 11 0 | 11 |  | 11 | 11 0 | 11 |
|  |  |  |  |  |  |  |  |  |  |  |  |  |  |  |  |
|  | 00 | 00 1 | 11 |  | 11/01 | 01/00 1 | 11 |  | 11 | 01/00 1 | 11 |  | 11 | 01/00 1 | 11 |
|  | 00 | 11/01 1 | 11 |  | 11 | 11 0 | 11 |  | 11 | 11 0 | 11 |  | 11 | 11 0 | 11 |
|  | 01/00 ?/1 | 11 | 11 |  | 11 | 11 0 | 11 |  | 11 | 11 0 | 11 |  | 11 | 11 0 | 11 |
|  | 01/00 ?/1 | 11 | 11 |  | 11 | 11 0 | 11 |  | 11 | 11 0 | 11 |  | 11 | 11 0 | 11 |

MEMORY DEVICE AND OPERATING METHOD THEREOF FOR REDUCING INTERFERENCE BETWEEN MEMORY CELLS

TECHNICAL FIELD

The disclosure relates in general to a memory device and an operating method thereof, and more particularly to a memory device and an operating method thereof for reducing interference between memory cells.

BACKGROUND

Non-volatile memory devices such as flash memory is in increasing demand with an increase of applications that handle a large volume of data such as image or moving image in a mobile device or the like. A flash memory device stores information in numerous memory cells There is a problem with a highly integrated flash memory containing much smaller cells that interference between adjacent cells spreads the width of the threshold voltage distribution. For example, during programming process, interference between the memory cells may occur due to capacitive coupling between nearby cells. For Single-Level Cell (SLC) memory or Multi-Level Cell (MLC) memory, the interference problem may decrease the sensing window and cause worse data retention.

Therefore, there is a need to provide a technology for reducing the interference between memory cells.

SUMMARY

The disclosure is directed to a memory device and an operating method thereof for reducing interference between memory cells.

According to one embodiment, an operating method of a memory device comprising a memory array of a plurality of memory cells is provided. The operating method comprises the following steps: a first page buffer receives a first input data to be programed into a first memory cell of the memory cells; a second page buffer receives a second input data to be programed into a second memory cell of the memory cells; and the first page buffer determines whether to shift a program verify (PV) voltage for the first input data according to the first and second input data.

According to another embodiment, a memory device is provided. The memory device comprises a memory array of a plurality of memory cells, a first page buffer receiving a first input data to be programed into a first memory cell of the memory cells, and a second page buffer receiving a second input data to be programed into a second memory cell of the memory cells, wherein the first page buffer determines whether to shift a PV voltage for the first input data according to the first and second input data.

BRIEF DESCRIPTION OF THE DRAWINGS

FIG. 6 is a data combination example showing different data with different layers of page buffers using one window definition algorithm.

FIG. 7 is a data combination example showing different data with different page buffers using a new window definition algorithm according to one embodiment of the present invention.

FIG. 11 shows the possible cell threshold voltage stages with pre-read data.

FIG. 12 shows the possible pre-read data with the shift flags.

Figure 1:
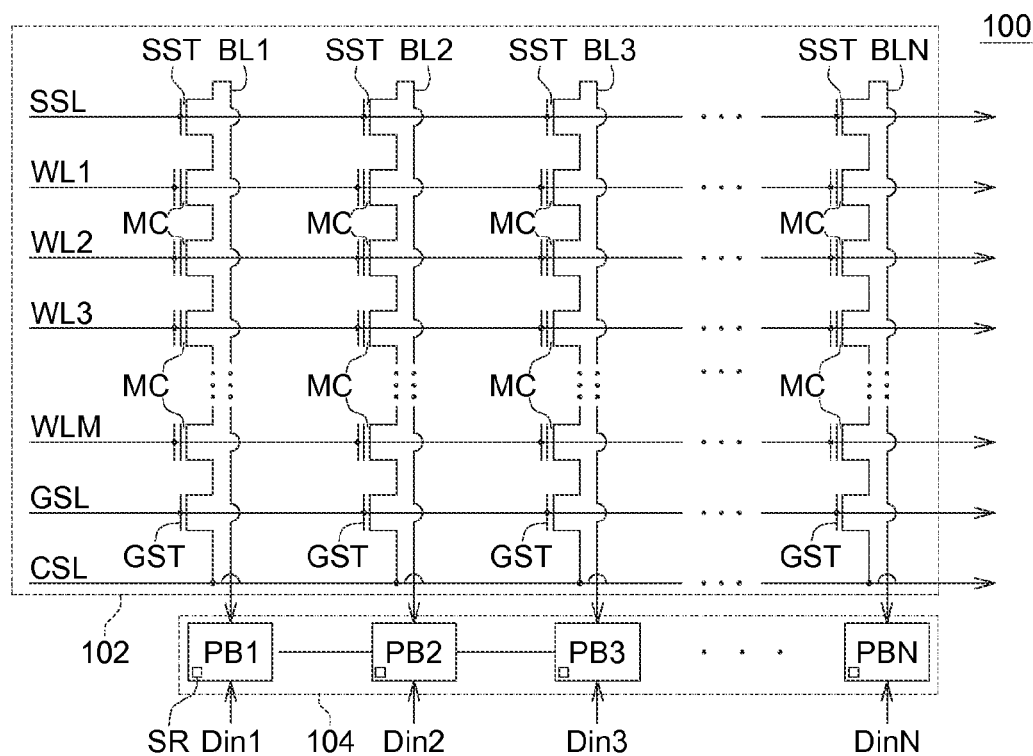
FIG. 1 shows a simplified block diagram of a memory device according to various embodiments of the present invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 shows a simplified block diagram of a memory device 100 according to various embodiments of the present invention. The memory device 100 comprises a memory array 102 of a plurality of memory cells MC and a page buffer circuit 104 including a plurality of page buffers PB1-PBN coupled to the memory array 102.

The memory cell array 102 comprises a plurality of memory cells MC connected in series between a bit line (BL1, BL2, BL3, . . . , or BLN) and a ground select line GSL. A string select transistor SST is selectively switched on to couple the associated memory cell string and the bit line together. The ground select transistor GST is selectively switched to control the connection between each memory cell string and a common source line CSL. Bit lines BL1-BLN are connected to page buffers PB1-PBN. Word lines WL1-WLN are connected to the control gates of the memory cells MC. The page buffers PB1-PBN perform the programming and reading operations of the selected memory cells. In one embodiment, each page buffer PB1, PB2, PB3, . . . , PBN comprises a corresponding shift register SR for storing a shift flag R. Details about the shift register SR will be described later.

Figure 2A:
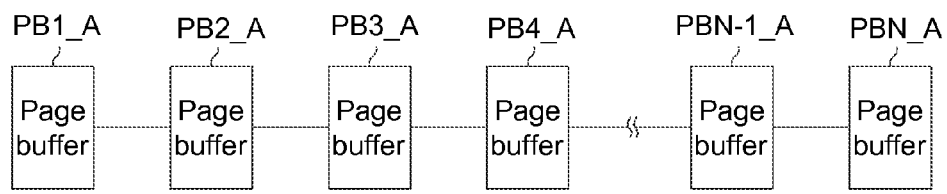
FIG. 2A shows possible signal paths between the page buffers according to one embodiment of the present invention.

In the embodiments of the present invention, each page buffer can communicate with other page buffers via signal paths. FIG. 2A shows possible signal paths between the page buffers according to one embodiment of the present invention. In FIG. 2A, each page buffer PA1_A, PB2_A, . . . , PBN_A is electrically coupled to the next page buffer. For example, the page buffer PB1_A is electrically coupled to the next page buffer PB2_A, and the page buffer PB2_A is electrically coupled to the next page buffer PB3_A.

Figure 2B:
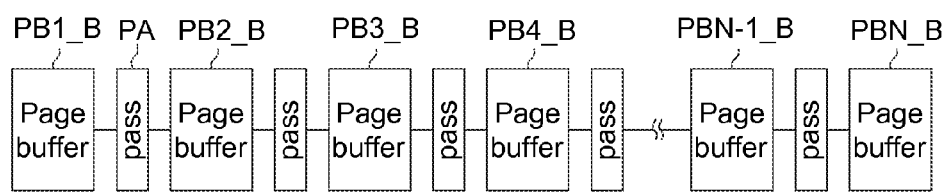
FIG. 2B shows possible signal paths between the page buffers according to another embodiment of the present invention.

FIG. 2B shows possible signal paths between the page buffers according to another embodiment of the present invention. In FIG. 2B, each page buffer PA1_B, PB2_B, . . . , PBN_B is electrically coupled to the next page buffer through a pass element PA. The pass element PA can be any circuit or component which allows the signal passes through.

Figure 2C:
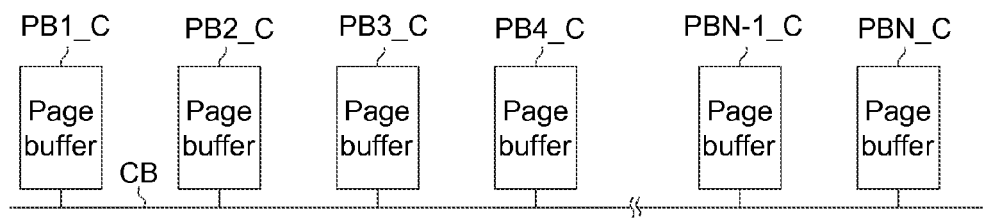
FIG. 2C shows possible signal paths between the page buffers according to another embodiment of the present invention.

FIG. 2C shows possible signal paths between the page buffers according to another embodiment of the present invention. In FIG. 2C, all page buffers PA1_C, PB2_C, . . . , PBN_C are electrically coupled to a common bus CB.

Figure 2D:
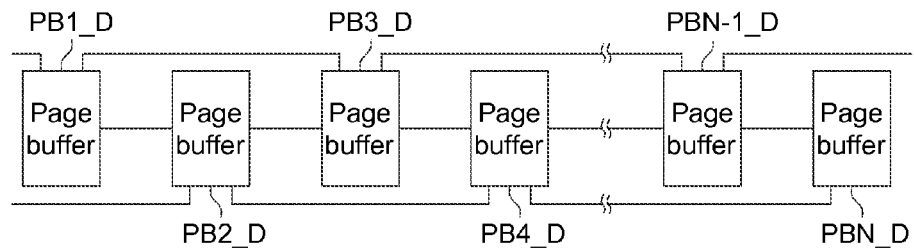
FIG. 2D shows possible signal paths between the page buffers according to another embodiment of the present invention.

FIG. 2D shows possible signal paths between the page buffers according to another embodiment of the present invention. In FIG. 2D, each page buffer PA1_D, PB2_D, . . . , PBN_D is electrically coupled to the next page buffer and the after next page buffer. For example, the page buffer PB1_D is collectively coupled to the next page buffer PB2_D and the after next page buffer PB3_D.

Figure 2E:
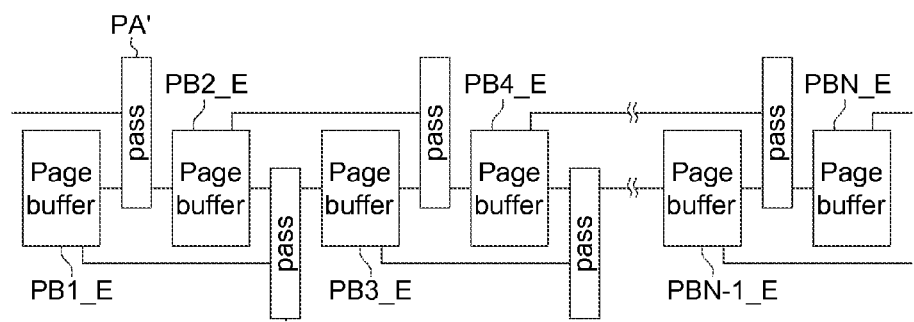
FIG. 2E shows possible signal paths between the page buffers according to another embodiment of the present invention.

FIG. 2E shows possible signal paths between the page buffers according to another embodiment of the present invention. In FIG. 2E, each page buffer PA1_E, PB2_E, . . . , PBN_E is electrically coupled to the next page buffer and the after next page buffer through pass elements. For example, the page buffer PB1_D is electrically coupled to the next page buffer PB2_D and the after next page buffer PB3_D through the pass elements PA' and PA", respectively.

Figure 2F:
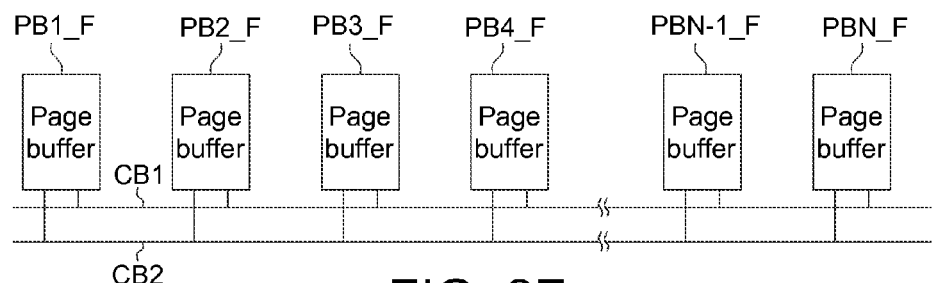
FIG. 2F shows possible signal paths between the page buffers according to another embodiment of the present invention.

FIG. 2F shows possible signal paths between the page buffers according to another embodiment of the present invention. In FIG. 2F, all page buffers PA1_F, PB2_F, . . . , PBN_F are electrically coupled together through more than one common buses CB1 and CB2.

Figure 3:
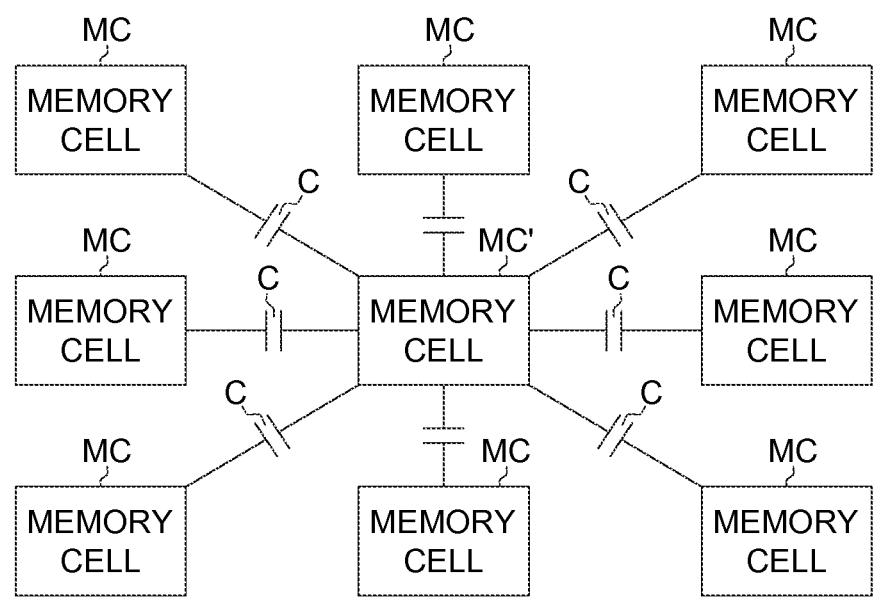
FIG. 3 is a schematic diagram illustrating the coupling interference between the memory cells.

FIG. 3 is a schematic diagram illustrating the coupling interference between the memory cells MC. As shown in FIG. 3, for a specific memory cell MC, the threshold voltage state is interfered by changing the threshold voltage states on one or more of the memory cells MC nearby the specific memory cell MC. The interference is due to the capacitive coupling C between neighboring memory cells MC. Generally, the interference between neighboring memory cells MC needs to be reduced because once a threshold voltage is set on the specific memory cell MC', it is disadvantageous to have the programming of neighboring memory cells MC affect and change the threshold voltage already programmed onto that specific memory cell MC'.

To reduce of the coupling interference between the memory cells MC, in the embodiments of the present invention, a page buffer (PB1, PB2, PB3, . . . , or PBN) can communicate with other page buffers (through the signal paths shown in FIGS. 2A-2F, foe example) to process the received input data (Din1, Din2, Din3, . . . , DinN) and determine the proper program verify (PV) voltage for programing operation.

Figure 4:
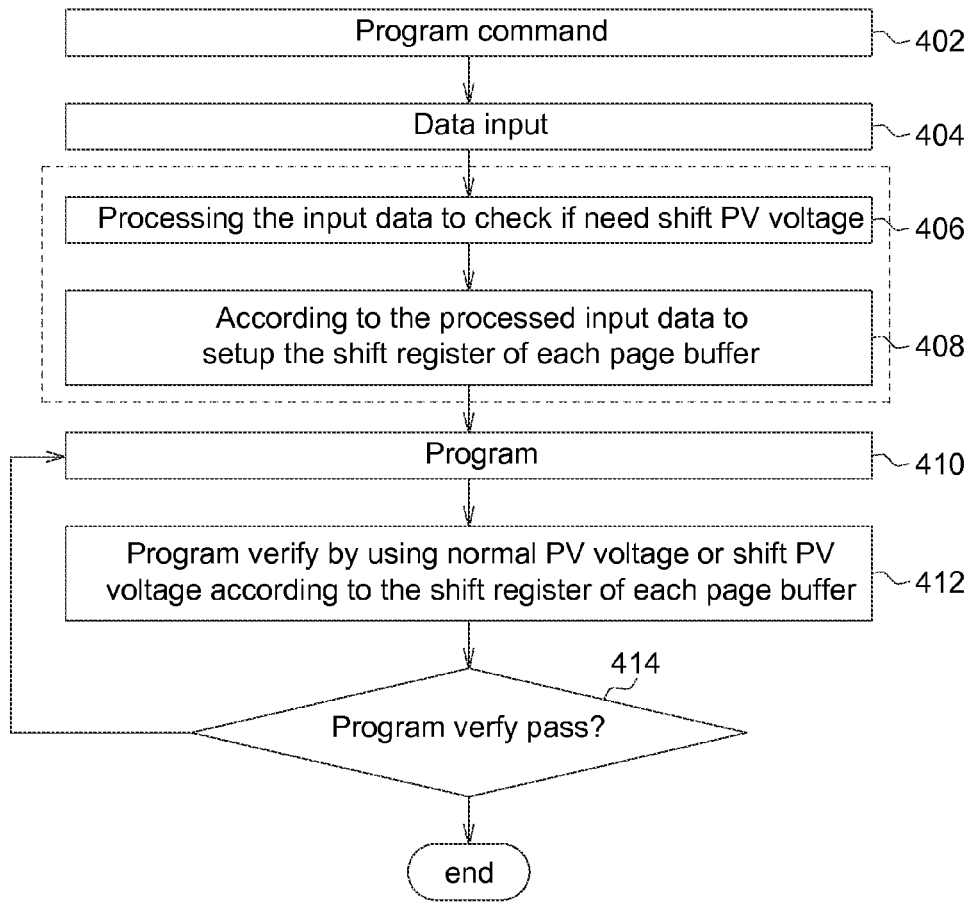
FIG. 4 is a flow chart showing the programing procedure of the memory device according to one embodiment of the present invention.

FIG. 4 is a flow chart showing the programing procedure of the memory device 100 according to one embodiment of the present invention. First, at step 402, the memory device 100 receives a program command. Then, at step 404, the memory device 100 receives input date Din1, Din2, Din3, . . . , DinN. At step 406, the memory device 100 process the input data Din1, Din2, Din3, . . . , DinN to check if need shift the PV voltage. Next, at step 408, the memory device 100 setups the shift flag R of the shift register SR of each page buffer PB1, PB2, PB3, . . . , PBN according to the processed input data. In one embodiment, the shift flag R=1 means shift, and the shift flag R=0 means not shift, but the present invention is not limited thereto. At step 410, the memory device 100 performs programing operation. At step 412, the memory device 100 performs program verifying operation by using normal (non-shifted) PV voltage or shifted PV voltage according to the value of the shift flags R. Then, at step 414, the memory device 100 determines whether the program verifying operation passes or not. If yes, the programing operation is finished. If not, the flow is turned back to step 410.

Taking page buffers PB1 and PB2 for example, the page buffer PB1 can determine the level of PV voltage for the corresponding memory cell MC according to the input data Din1 and Din2. It is understood the present invention is not limited to the above-mentioned examples, a page buffer can check data stored in one or more other page buffers to determine the level of PV voltage for programming. For example, in one embodiment, the page buffer PB2 can determine the level of PV voltage for the corresponding memory cell MC according to the first and third input data Din1 and Din3.

Figure 5:
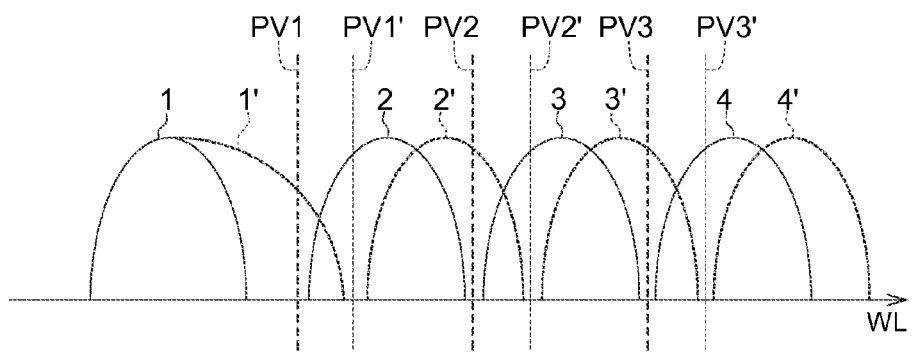
FIG. 5 shows a graphical representation of threshold voltage distribution of the memory cell.

FIG. 5 shows a graphical representation of threshold voltage distribution of the memory cell MC. In FIG. 5, the threshold voltage distribution is divided into two groups: a group of shifted threshold voltage distribution and a group of non-shifted threshold voltage distribution. The non-shifted threshold voltage distribution comprises four states "1", "2", "3" and "4." The shifted threshold voltage distribution comprises four shifted states "1'", "2'", "3'" and "4'." Generally, the shifted threshold voltage states "1'", "2'", "3'" and "4'" can be shifted higher to maintain the sensing window when the interference effect spreads the width of the threshold voltage distribution.

In one embodiment, depending on the self input data and the neighbor input data, the page buffer can choose using the non-shifted PV voltages (PV1, PV2, PV3) to perform the programming operation (if the processed input data corresponds to a non-shifted threshold voltage state "1", "2", "3", "4"), or using the shifted PV voltages (PV1', PV2', PV3') to perform the programming operation (if the processed input data corresponds to a shifted threshold voltage state "1", "2", "3", "4"). Specifically, in one embodiment, assume that the page buffers PB1-PB3 are located at the first to third layers of a 3D memory structure along Z-direction. The page buffer PB2 can determine whether to shift the PV voltage according to the input data of the page buffer PB2 itself and the neighbor input data of its neighbor page buffers PB1 and/or PB3. Details about the determination mechanism will be described latter.

FIG. 6 is a data combination example showing different data with different layers of page buffers PB1-PB3 (assume that the page buffers PB1-PB3 are responsible for memory cells MC located at the first to third layers of a 3D memory structure along Z-direction) using one window definition algorithm. In FIG. 4, each page buffer PB1, PB2, PB3 stores data according to its input data and uses the same PV voltage for the same data. For example, if the data of both page buffers PB1 and PB3 are corresponding to the threshold voltage state "1", the page buffer PB2 would store data "1", "2", "3" or "4" only according to its input data and choose the non-shifted PV voltages for the input data; if the data of both neighbor page buffers PB1 and PB3 are corresponding to the threshold voltage state "4", the page buffer PB2 would store data "1", "2", "3" or "4" still only according to the its input data and choose the same PV voltages for the same data.

FIG. 7 is a data combination example showing different data with different page buffers PB1-PB3 using a new window definition algorithm according to one embodiment of the present invention. The main difference between the present embodiment and the previous embodiment shown in FIG. 6 is that each page buffer PB1, PB2, PB3 stores data not only according to the self input data but also the neighbor input data of the neighbor page buffers, and accordingly determines which non-shifted of shifted PV voltage to use.

In one embodiment, a page buffer can make the above-mentioned determination based on the following rules:

(1) if one of the neighbor input data is corresponding to the threshold voltage state "4", then shift the self input data to a shifted threshold voltage state and use the shifted PV voltage for the shifted input data;

(2) if the self input data is corresponding to the threshold voltage state "4" and one of the neighbor input data is corresponding to the threshold voltage state "3", then shift the threshold voltage state of the self input data from "4" to "4'".

As shown in FIG. 7, if the input data of one of the page buffers PB1 and PB3 is corresponding to the threshold voltage state "4", then the page buffer PB2 would shift the its input data, which corresponding to the threshold voltage states of "1", "2", "3" and "4", to the shifted threshold voltage states of "1'", "2'", "3'" and "4'", respectively. On the other hand, if the input data of one of the page buffers PB1 and PB3 is corresponding to the threshold voltage state "3" and the input data of the page buffer PB2 is corresponding to the threshold voltage state "4", then the page buffer PB2 would shift the its input data to a shifted threshold voltage state of "4'". As mentioned earlier, for the shifted input data, the page buffer PB2 can use the corresponding shifted PV voltage to perform programing operation.

Figure 8:
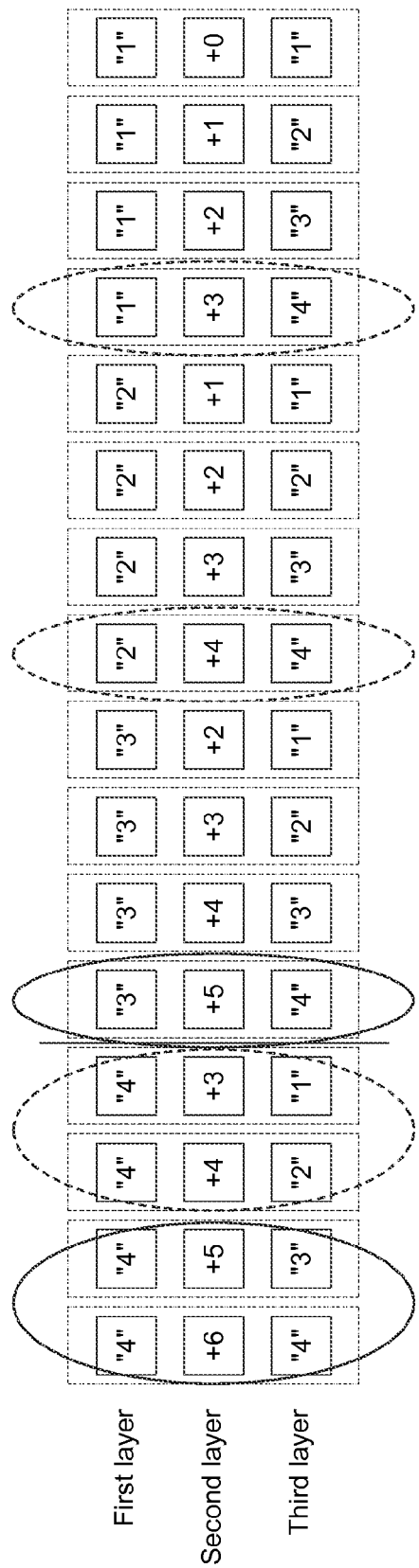
FIG. 8 shows an example of the interference levels with different data combination.

The above-mentioned rule can be derived from an interference level for a memory cell MC. FIG. 8 shows an example of the interference levels with different data combination. Because higher threshold voltage stage of the neighbor memory cell MC may cause more serious interference of the target memory cell MC, the interference level of the target memory cell MC can be properly determined according to the neighbor data. Specifically, in the example of FIG. 8, if the threshold voltage stage of a memory cell MC is "4", then the interference level of its neighbor memory cell MC will add 3; if the threshold voltage stage of a memory cell MC is "3", then the interference level of its neighbor memory cell MC will add 2; if the threshold voltage stage of a memory cell MC is "2", then the interference level of its neighbor memory cell MC will add 1; and if the threshold voltage stage of a memory cell MC is "1", then the interference level of its neighbor memory cell MC will add 0. Therefore, if the memory cells MC located at first and third layers are corresponding to a threshold voltage stage of "4", then an intermediated memory cell MC, which is located at the second layer, may get the largest interference level "+6". If the window loss by interference levels "+6" and "+5", together with the cases that one of the neighbor memory cells MC is to be programed to a threshold voltage stage of "4", are designed to be solved (which need use shift PV voltages), the data combination shown in FIG. 7 can then be established.

Figure 9:
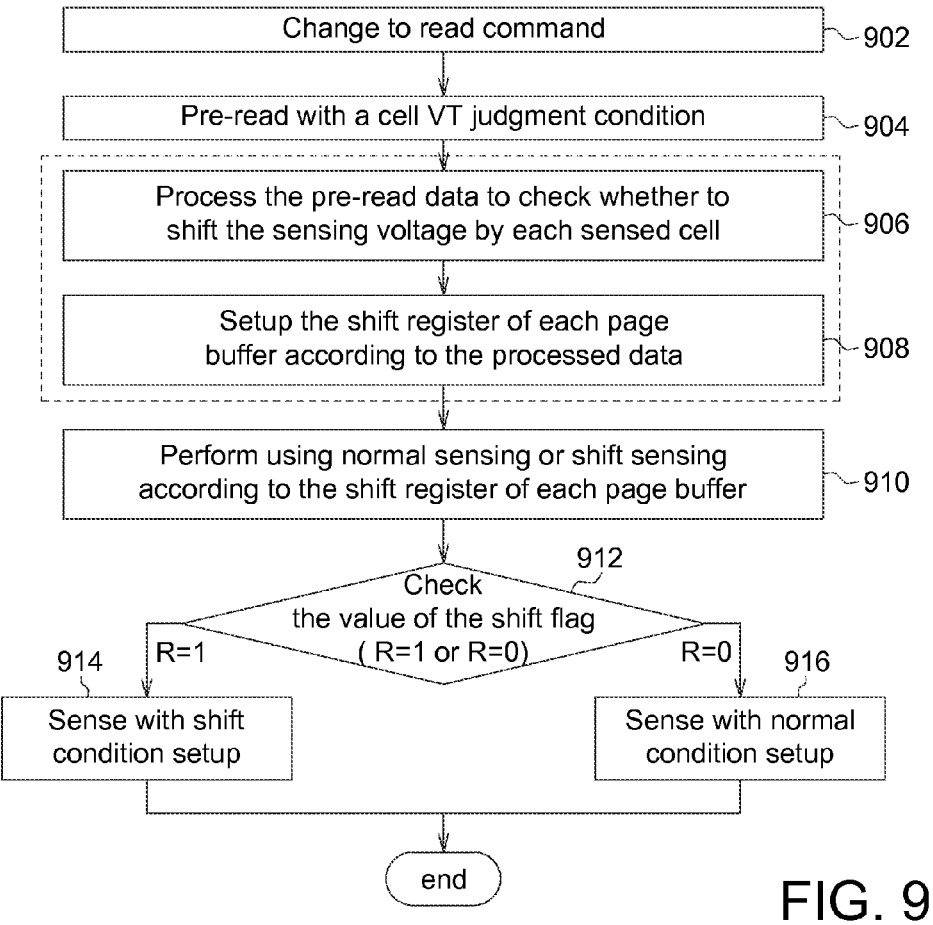
FIG. 9 is a flow chart showing the read procedure of the memory device 100 according to one embodiment of the present invention.

FIG. 9 is a flow chart showing the read procedure of the memory device 100 according to one embodiment of the present invention. At step 902, the memory device 100 receives a read command. At step 904, the memory device 100 performs pre-read with a cell threshold voltage judgment condition. At step 906, the memory device 100 processes the pre-read data to check whether to shift the sensing voltage by each sensed memory cell MC. At step 908, the memory device 100 setups the shift register SR of each page buffer PB1, PB2, PB3, ... , PBN according to the processed data. Each shift register SR stores a shift flag R for indicating whether to shift the PV voltage, where shift flag R=1 means shift, shift flag R=0 means not shift, for example. At step 910, the memory device 100 performs normal (non-shift) sensing or shift sensing according to the value of shift flag R of each page buffer. At step 912, the memory device 100 checks the value of the shift flag R for each page buffer PB1, PB2, PB3, ... , PBN. If the shift flag R=1, then step 914 is performed, the memory device 100 performs sensing with shift condition setup (e.g., using shifted sensing voltages to perform the sensing). If the shift flag R=0, then step 916 is performed, the memory device 100 performs sensing with normal condition setup (e.g., using non-shifted sensing voltages to perform the sensing).

Figure 10:
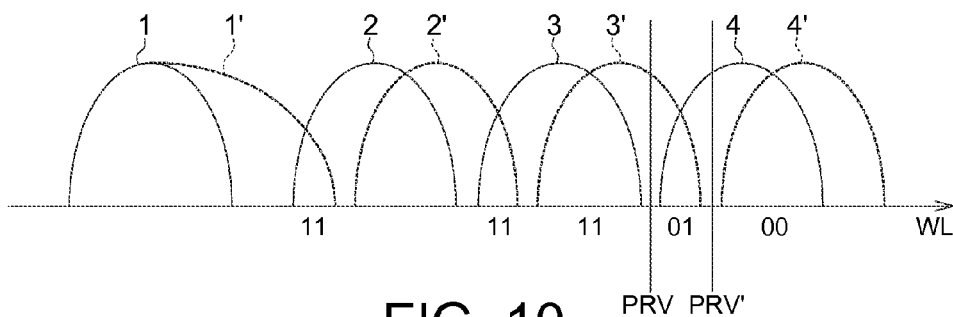
FIG. 10 shows a graphical representation of the threshold voltages for the pre-read procedure.

FIG. 10 shows a graphical representation of the threshold voltages for the pre-read procedure. During the pre-read procedure, a page buffer PB1, PB2, PB3, ... , PBN may perform a first read operation with a first sensing voltage PRV on the target memory cell MC to obtain a first sensing result and performs a second read operation with a second sensing voltage PRV' on the target memory cell MC to obtain a second sensing result. The page buffer can determine whether to shift the PV voltage according to a pre-read data including the first and second sensing results. For example, if the cell threshold voltage is larger than the first sensing voltage PRV, the first sensing result is "0"; if the threshold voltage is smaller than the first sensing voltage PRV, the first sensing result is "1". Similarly, if the threshold voltage is larger than the second sensing voltage PRV', the second sensing result is "0"; if the threshold voltage is smaller than the second sensing voltage PRV', the second sensing result is "1". The pre-read data can be obtained by combining the first and second sensing results. For example, if the first sensing result is "0" and the second sensing result is "1", then the corresponding pre-read data is "01".

Referring to FIG. 10 again, if the pre-read data is "11", it means that the cell threshold voltage stage might be "1", "1'", "2", "2'", "3" or "3'". If the pre-read data is "01", it means that the cell threshold voltage stage might be "3'" or "4". If the pre-read data is "00", it means that the cell threshold voltage stage might be "4" or "4'". The possible cell threshold voltage stages CVT with pre-read data PRD is shown in FIG. 11.

FIG. 12 shows the possible pre-read data PRD with the shift flags R. In FIG. 12, if the shift register SR sets the shift flag R=1, it means that the memory cell MC need to be read by shift condition; if the shift register SR sets the shift flag R=0, it means not to shift. In one embodiment, the page buffer can utilize the following four rules to determine the value of the shift flag R:

(1) Rule 1: if the pre-read data is "00", it means that the data must be corresponding to the threshold voltage state "4", so the shift registers of both neighbor memory cells set the shift flag R="1";

(2) Rule 2: if the self sensing data is "00" and the neighbor data are "01", then the self shift register sets the shift flag R="1";

(3) Rule 3: if the self sensing data is "01" and the both neighbor data are "11", then the shift registers of both neighbor page buffers sets the shift flag R="1"; and (4) Rule 4: for two page buffers adjacent to each other, there is no "01" "01" condition in the pre-read data.

As shown in FIG. 12, if the pre-read data PRD of the page buffers PB1, PB2 and PB3 are "00", according to Rule 1, the shift register SR of page buffer PB2 should set the shift flag R=1. Note that because when the pre-read data is "00" the cell threshold voltage stage CVT might be "4" or "4'", it can then be obtained that the cell threshold voltage stage CVT sensed by the page buffer PB2 is "4".

In FIG. 12, "?" means the shift flag R is dependent on the neighbor data. For example, if the pre-read data PRD of the page buffers PB1, PB2 and PB3 are "01", "11" and "01", respectively, the shift flag R of the page buffer PB2 should be decided depending on the neighbor cell condition of the page buffers PB1 and PB3. For example, assume that the pre-read data PBD of the page buffers (not including page buffer PB2) neighbor to the page buffers PB1 and PB3 are "11". According to Rule 3, the shift flag R of the page buffer PB2 is "1". On the other hand, assume that the pre-read data PRD of the page buffers neighbor to the page buffers PB1 and PB3 are "00". According to Rule 1, the shift flags R of the page buffers PB1 and PB3 are "1". At this time, it can be obtained that the cell threshold voltage stages CVT for the memory cells MC corresponding to the page buffers PB1 and PB3 are "3", and thus the shift flag R of the page buffer PB2 is "0". Note that there is no "01" "01" condition in pre-read data according to Rule 4, so it is not required to assume that the page buffers neighbor to the page buffers PB1 and PB3 are "01".

Based on the above, the memory device and the operating method thereof according to the embodiments of the present invention use data stored in the page buffers to determine the interference level for the target memory cell. Each page buffer can determine whether to shift the PV voltage according to the self input data and the neighbor input data. Therefore, an appropriate PV voltage level can be chosen for programming the target memory cell and the coupling interference between memory cells can be reduced. Furthermore, with the help of the pre-read procedure, actual data stored in the target memory cell can be obtained.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. An operating method of a memory device comprising a memory array of a plurality of memory cells, comprising:
receiving, by a first page buffer, a first input data to be programmed into a first memory cell of the memory cells;
receiving, by a second page buffer, a second input data to be programmed into a second memory cell of the memory cells; and
determining, by a first page buffer, whether to shift a program verify (PV) voltage for the first input data according to the first and second input data.

2. The operating method according to claim 1, wherein the first and second page buffers communicate with each other through one or more signal paths.

3. The operating method according to claim 1, further comprising:
storing, by the first page buffer, a data according to the first and second input data.

4. The operating method according to claim 1, wherein the first page buffer comprises a first shift register, the operating method further comprises:
setting up the first shift register according to determination results of said determining whether to shift the PV voltage.

5. The operating method according to claim 4, wherein the first shift register comprises a first flag, the operating method further comprises:
setting the first flag as a first value if the determination results indicating to shift the PV voltage; and
using a shifted PV voltage to program verifying the first memory cell when the first flag is set as the first value.

6. The operating method according to claim 1, further comprising:
receiving, by a third page buffer, a third input data to be programmed into a third memory cell of the memory cells;
determining an interference level for the first memory cell according to the second and third input data; and
determining whether to shift the PV voltage according to the interference level.

7. The operating method according to claim 6, wherein the first memory cell is intermediate between the second and third memory cells.

8. The operating method according to claim 1, further comprising:
generating a pre-read data to determine whether data stored in the first memory cell is shifted or not; and
determining using non-shifted sensing voltages or shifted sensing voltages to sense the first memory cell according to the pre-read data.

9. The operating method according to claim 8, wherein said generating the pre-read data further comprises:
performing a first read operation on the first memory cell to obtain a first sensing result;
performing a second read operation on the first memory cell to obtain a second sensing result; and
generating the pre-read data by combining the first and second sensing results.

10. The operating method according to claim 1, wherein the first page buffer is electrically coupled to the second page buffer through a pass element to communicate with each other.

11. A memory device comprising:
a memory array of a plurality of memory cells;
a first page buffer receiving a first input data to be programmed into a first memory cell of the memory cells; and
a second page buffer receiving a second input data to be programmed into a second memory cell of the memory cells;
wherein the first page buffer determines whether to shift a program verify (PV) voltage for the first input data according to the first and second input data.

12. The memory device according to claim 11, wherein the first and second page buffers communicate with each other through one or more signal paths.

13. The memory device according to claim 11, wherein first page buffer stores data according to the first and second input data.

14. The memory device according to claim 11, wherein the first page buffer comprises a first shift register, and the first shift register sets up the first shift register according to determination results of whether to shift the PV voltage.

15. The memory device according to claim 11, wherein the first shift register comprises a first flag, wherein the first page buffer sets the first flag as a first value if the determination results indicating to shift the PV voltage, and uses a shifted PV voltage to program verifying the first memory cell when the first flag is set as the first value.

16. The memory device according to claim 11, further comprising:
a third page buffer receiving a third input data to be programed into a third memory cell of the memory cells;
wherein the first page buffer determines an interference level for the first memory cell according to the second and third input data, and determines whether to shift the PV voltage according to the interference level.

17. The memory device according to claim 16, wherein the first memory cell is intermediate between the second and third memory cells.

18. The memory device according to claim 11, wherein the first page buffer generates a pre-read data to determine whether data stored in the first memory cell is shifted or not, and determines using non-shifted sensing voltages or shifted sensing voltages to sense the first memory cell according to the pre-read data.

19. The memory device according to claim 18, wherein the first page buffer performs a first read operation on the first memory cell to obtain a first sensing result, performs a second read operation on the first memory cell to obtain a second sensing result, and generates the pre-read data by combining the first and second sensing results.

20. The memory device according to claim 11, wherein the first page buffer is electrically coupled to the second page buffer through a pass element to communicate with each other.

* * * * *